US005132556A

United States Patent [19]

Cheng

[11] Patent Number: 5,132,556

[45] Date of Patent: Jul. 21, 1992

[54] BANDGAP VOLTAGE REFERENCE USING BIPOLAR PARASITIC TRANSISTORS AND MOSFET'S IN THE CURRENT SOURCE

[75] Inventor: Fred T. Cheng, Cupertino, Calif.

[73] Assignee: Samsung Semiconductor, Inc., San Jose, Calif.

[21] Appl. No.: 438,909

[22] Filed: Nov. 17, 1989

[51] Int. Cl.[5] .......... H03K 3/01; G06G 7/10

[52] U.S. Cl. .......... 307/296.7; 307/491; 307/495; 307/310; 323/315; 323/316

[58] Field of Search .......... 307/296.6, 296.7, 491, 307/495, 310; 323/313, 314, 316

[56] References Cited

U.S. PATENT DOCUMENTS

| | | | |
|---|---|---|---|
| 3,586,987 | 6/1971 | Fullagar | 307/296.6 |
| 3,976,896 | 8/1976 | Ryder | 307/296.6 |
| 4,263,519 | 4/1981 | Schade, Jr. | 307/296.6 |
| 4,317,054 | 2/1982 | Caruso et al. | 307/296.6 |
| 4,349,778 | 9/1982 | Davis | 307/296.6 |
| 4,375,595 | 3/1983 | Ulmer et al. | 307/296.6 |
| 4,571,507 | 2/1986 | Collings | 307/296.6 |
| 4,577,119 | 3/1986 | Kim et al. | 307/296.6 |
| 4,588,941 | 5/1986 | Kerth et al. | 323/314 |
| 4,751,454 | 6/1988 | Dielacher et al. | 323/314 |

OTHER PUBLICATIONS

P. Horowitz et al., "The Art of Electronics," Cambridge University Press, Cambridge, 1986, p. 65.

J. Millman et al., "Integrated Electronics: Analog and Digital Circuits and Systems", McGraw-Hill Book Company, New York, 1972, p. 39.

Degrauwe et al., "CMOS voltage references using lateral bipolar transistors," in IEEE Journal of Solid State Circuits, vol. SC-20, No. 67, Dec. 1985, pp. 1151-1157.

*Primary Examiner*—Stanley D. Miller
*Assistant Examiner*—Richard Roseen
*Attorney, Agent, or Firm*—Skjerven, Morrill, MacPherson, Franklin & Friel

[57] ABSTRACT

In a CMOS bandgap reference circuit, the respective collectors of two lateral parasitic NPN transistors are connected to the two nodes of a current mirror. The emitter circuit of the first parasitic NPN transistor includes a resistor, whereby the base-emitter junction current densities of the parasitic NPN transistors are maintained at a preselected ratio. A second resistor common to the emitter circuit of both parasitic NPN transistors is provided, whereby $\Delta V_{BE}$ having a positive temperature coefficient and $V_{BE}$ of the second parasitic NPN transistor having a negative temperature coefficient cancel one another. The temperature independent voltage across the common resistor and the base-emitter junction of the second transistor is buffered by a unity gain amplifier. The output of the unity gain amplifier is used to drive the parasitic NPN transistors and also is furnished as the reference voltage.

11 Claims, 3 Drawing Sheets

BANDGAP VOLTAGE REFERENCE USING BIPOLAR PARASITIC TRANSISTORS AND MOSFET'S IN THE CURRENT SOURCE

BACKGROUND OF THE INVENTION

1. Field of the Invention

This invention relates to CMOS circuits for generating a bandgap reference voltage, and more particularly to bandgap reference circuits that have reduced initial voltage reference error and temperature drift.

2. Description of Related Art

Reference voltage circuits are used by integrated circuit designers for many purposes, including analog to digital converters, regulated power supplies, comparator circuits, and some types of logic circuits. A particularly useful type of reference voltage circuit is the "bandgap" reference circuit, also known as the $V_{BE}$ reference circuit, the theory of which is to generate a voltage with a positive temperature coefficient having the same magnitude as the negative temperature coefficient of $V_{BE}$; then to add $V_{BE}$ to the generated voltage to cancel the temperature dependency.

One type of parasitic npn bipolar transistors available from standard CMOS processes is a vertical transistor with its emitter, base and collector corresponding to, respectively, the source-drain n+ region, the p-well region, and the n- silicon substrate. The collectors of these parasitic vertical transistors are in the substrate, so that the transistors are suitable for use in a common collector configuration only.

One well known reference voltage circuit 10 which makes use of vertical parasitic transistors is illustrated in FIG. 1. VCC is applied at terminal 12, which corresponds to the substrate of the CMOS integrated circuit. Circuit ground is at terminal 14. Transistors 6 and 8 are parasitic NPN transistors, each of which uses the IC substrate for its collector, a P-well for its base, and an N-type drain/source region for its emitter. Resistors 20 and 22, which are the same value, are the load resistors for transistors 6 and 8 respectively. Resistor 24 is connected in the emitter circuit of transistor 6 to develop across it a temperature sensitive voltage.

The inputs of a differential amplifier 26 are connected across the equal valued resistors 20 and 22, and the output $V_{REF}$, or reference voltage, is fed back to drive the bases of transistors 6 and 8. Due to this feedback, the potentials across the differential inputs at nodes 27 and 28 are equal (assuming amplifier 26 to be perfect, i.e. having infinite gain and input impedance). Even so, the current density in the emitter of transistor 6 is less than that of transistor 8 because of the voltage developed across resistor 24. Hence, transistors 6 and 8 exhibit different base-emitter potentials given by $$\Delta V_{BE} = V_{BE8} - V_{BE6} = \left(\frac{kT}{q}\right)\ln\left(\frac{I_8}{I_6}\,\frac{A_6}{A_8}\right) \quad (1)$$

wherein T is absolute temperature, k is the Boltzman constant, q is the charge of an electron, and $I_8/I_6$, $A_6/A_8$ are the ratios of the current and emitter area of transistors 8 and 6 respectively. The quantity kT/q is also known as the "volt-equivalent of temperature," and commonly represented by $V_T$.

The difference in base-emitter potential $\Delta V_{BE}$ between transistors 6 and 8 appears across resistor 24 with a positive temperature coefficient. Since the current producing $V_{R24}$ also flows through resistor 20, $\Delta V_{BE}$ having a positive temperature coefficient is imposed across resistor 22. Since resistors 20 and 22 are matched and the potential at nodes 27 and 28 maintained equal, a positive temperature coefficient attributable to $\Delta V_{BE}$ also is imposed across resistor 22. As $V_{BE8}$ is of negative temperature coefficient, the one can be used to offset the other.

The value of $\Delta V_{BE}$ is set by establishing the respective emitter areas of transistors 6 and 8 at an appropriate ratio with the same $I_6$ and $I_8$, in accordance with equation 1. Temperature compensation is achieved by adjusting value of $R_{20}$, $R_{22}$ and $R_{24}$.

Unfortunately, ideal CMOS amplifiers suitable for use as amplifier 26 are not available. Practical CMOS differential amplifiers have a temperature dependent input offset voltage that reduces the effectiveness of the bandgap reference circuit 10. The effect of the input offset voltage VOS on the bandgap reference circuit 10 is given by:

$$V_{REF} = V_{BE8} + \left[\frac{R_{20}}{R_{24}}\ln(n)\right]V_T + \left(1 + \frac{R_{20}}{R_{24}}\right)V_{OS} \quad (2)$$

The input offset voltage of a CMOS differential amplifier typically is high; a value of greater than 2 mV is common. The ratio of (1+R20/R24) also is high; a value of 10 is common. Applying these common values, an error of 20 mV appears at the output of the amplifier 26, which does not permit the potential at nodes 27 and 28 to be maintained in equality.

Moreover, the input offset voltage is temperature dependent. The effect of this temperature dependency on the bandgap reference circuit 10 is given by the differential expression:

$$\frac{\partial V_{REF}}{\partial T} = \frac{\partial V_{BE8}}{\partial T} + \left[\frac{R_{20}}{R_{24}}\ln(n)\right]\frac{\partial V_T}{\partial T} + \left(1 + \frac{R_{20}}{R_{24}}\right)\frac{\partial V_{OS}}{\partial T} \quad (3)$$

It will be appreciated that the offset voltage temperature dependency term $\delta V_{OS}/\delta T$ is multiplied by the ratio $(1+R_{20}/R_{24})$, which further degrades performance of the bandgap reference 10.

Several approaches have been taken in recognition of the performance limitations of the bandgap reference 10. One approach is to improve the performance of the differential amplifier used in the bandgap reference circuit 10, but this approach places significant restraints on the design of the amplifier 26. In any event, many of the causes responsible for the temperature dependent input offset voltage also are process sensitive. Another approach is typlified by U.S. Pat. No. 4,375,595, issued Mar. 1, 1983 to Ulmer et al. This and other such approaches increase circuit complexity and chip cost, however.

Recently, parasitic lateral NPN transistors have been used in the design of improved CMOS bandgap reference circuits. Two such circuits are disclosed in Degrauwe et al., "CMOS voltage references using lateral bipolar transistors," in IEEE Journal of Solid State Circuits, Vol. SC-20, No. 67, Dec. 1985, pp. 1151-57. As shown in FIGS. 7(*a*) and 7(*b*) of the Degrauwe et al.

article, these circuits use lateral bipolar transistors in combination with a current mirror, an output amplifier, and a voltage controlled current source. Unfortunately, the voltage controlled current source itself is fairly complex, being implemented by five additional resistors and an additional lateral transistor. Hence, the size of the bandgap circuit is increased.

SUMMARY OF THE INVENTION

An object of the present invention is to provide a relatively simple and cost effective CMOS bandgap reference circuit with improved temperature stability.

This and other objects are achieved by the present invention, a CMOS bandgap voltage reference circuit which uses two parasitic lateral bipolar transistors. The collectors of the lateral transistors are connected to one another A first resistor has one end connected to the emitter of one of the bipolar transistors. A second resistor has one end connected to the other end of the first resistor and to the emitter of the other bipolar transistor, and the other end connected to the ground potential. An amplifier, is connected to the collector of the other bipolar transistor, and its output is connected to the bases of the bipolar transistors. The potential between the amplifier output and ground potential is a reference potential.

BRIEF DESCRIPTION OF THE DRAWINGS

In the Figures, wherein like reference numerals indicate like parts.

DESCRIPTION OF THE PREFERRED EMBODIMENT

Figure 1:
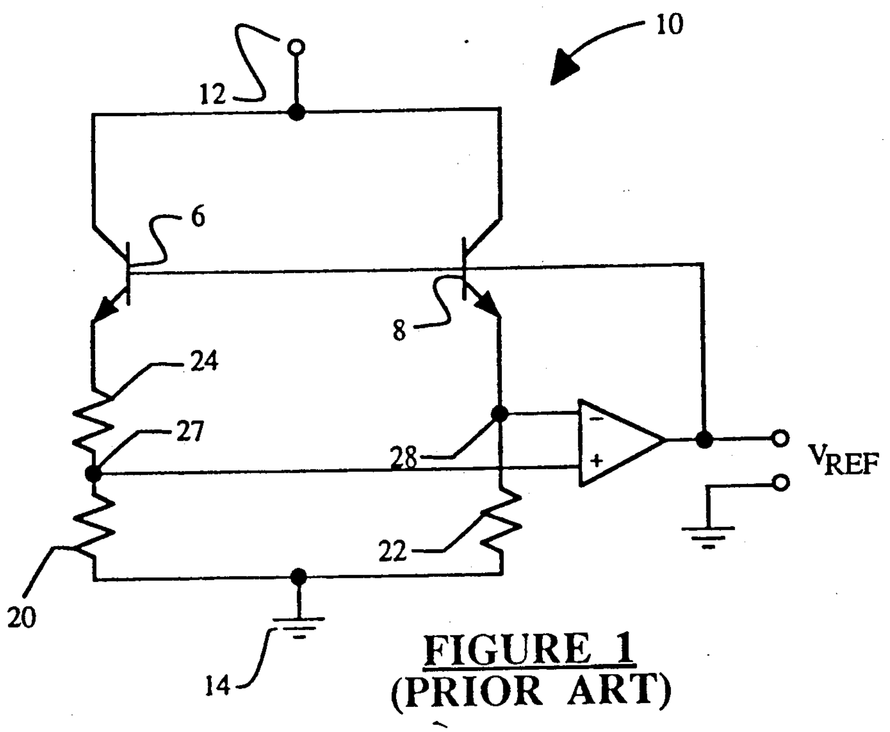
FIGURE 1 (PRIOR ART)
FIG. 1 is a schematic diagram of a prior art bandgap reference circuit.
Figure 2:
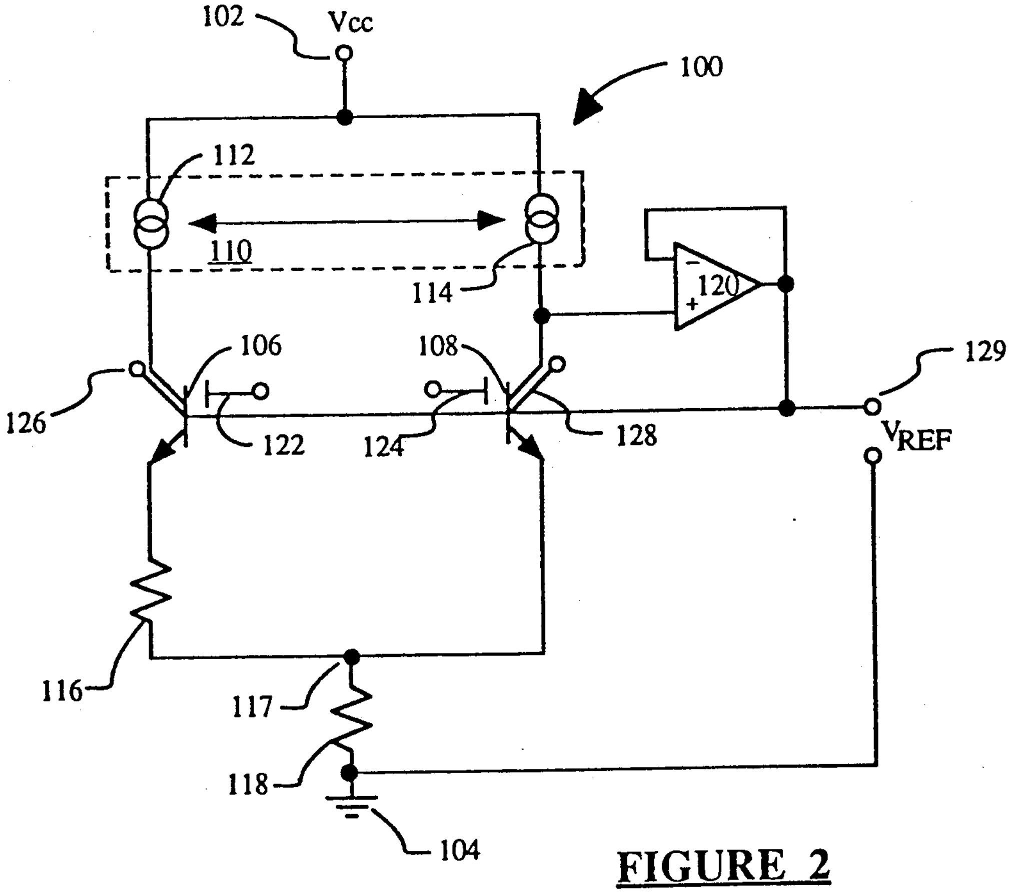
FIG. 2 is a generalized schematic diagram of a bandgap reference circuit in accordance with the present invention.

The reference voltage circuit 100 illustrated in FIG. 2 is suitable for fabrication with standard CMOS processes. Supply voltage VCC is applied at terminal 102, and circuit ground is provided at terminal 104. Transistors 106 and 108 are parasitic lateral NPN transistors, which include respective free collectors 126 and 128 and respective gates 122 and 124 which are biased as described below. A current mirror 110 comprising current sources 112 and 114 furnishes a current I112 to NPN transistor 106 and a current I114 to transistor 108, and maintains currents I112 and I114 equal. Resistors 116 is provided in the emitter circuit of transistor 106, and resistor 118 is provided in the emitter circuits of both transistors 106 and 108. A unity gain amplifier 120 has its input connected to the collector of transistor 108, and furnishes $V_{REF}$ at its output 129. $V_{REF}$ is fed back to the bases of transistors 106 and 108.

The operation of bandgap reference circuit 100 is as follows. Transistors 106 and 108 are driven by $V_{REF}$. When transistor 106 pulls an incremental amount of current out of source 112 of current mirror 110, source 114 produces an equal increment of current into transistor 108. Hence, the current mirror 110 forces current I112 into the collector of transistor 106 and current I114 into the collector of transistor 108 to be equal.

Transistors 106 and 108 are fabricated with substantially identical diffusion profiles. Because of the difference in emitter area, the current densities across the base-emitter regions of transistors 106 and 108 are not equal. The different current densities result in different potentials across the base-emitter junctions of transistors and 108, given by $$\Delta V_{BE} = V_{BE108} - V_{BE106} = \left(\frac{kT}{q}\right)\ln\left(\frac{J_{108}}{J_{106}}\right) \quad (4)$$

The difference in base-emitter potential $\Delta V_{BE}$ between transistors 106 and 108 appears across resistor 116 for the following reason. Two branches connect the node at the bases of transistors 106 and 108 and the node 117, and the potential across the branches are the same. The potential across one of the branches is $V_{BE108}$. The potential across the other branch is the sum of the voltage drop across the resistor 116 ("$V_{R116}$") and $V_{BE106}$. Node 117 forces $V_{R116}+V_{BE106}$ to equal $V_{BE108}$, or $$V_{R116}=V_{BE108}-V_{BE106} \quad (5)$$

Since applying equation 4 to transistors 106 and 108 yields the relationship $\Delta V_{BE}=V_{BE108}-V_{BE106}$, it follows that $V_{R116}$ equals $\Delta V_{BE}$.

The current producing $V_{R116}$ also produces a voltage drop across resistor 118, which has a positive temperature coefficient as is evident from the sign of $\Delta V_{BE}$. The positive temperature coefficient attributable to $\Delta V_{BE}$ is imposed across resistor 118, and is effective for offsetting the negative temperature coefficient of $V_{BE108}$.

The value of $V_{REF}$ is determined in accordance with the following expression:

$$V_{REF} = V_{BE108} + \left[\frac{R_{118}}{R_{116}}\ln(n)\right]V_T \quad (6)$$

where n is the ratio of emitter area of transistor 106 and 108. The appropriate ratio is established either by appropriately sizing the respective base-emitter regions or by connecting an appropriate number of identical transistors in parallel.

The temperature stability of bandgap reference 100 is given by:

$$\frac{\partial V_{REF}}{\partial T} = \frac{\partial V_{BE108}}{\partial T} + \left[\frac{R_{118}}{R_{116}}\ln(n)\right]\frac{\partial V_T}{\partial T} \quad (7)$$

Typically, $\delta V_{BE118}/\delta T$ is about $-2.0$ mV/degree C and $\delta V_T/\delta T$ is about $+0.085$ mV/degree C. The values of n and the ratio R118/R116 are selected to render $\delta V_{REF}/\delta T$ zero, whereby a zero temperature coefficient is achieved.

Figure 3:
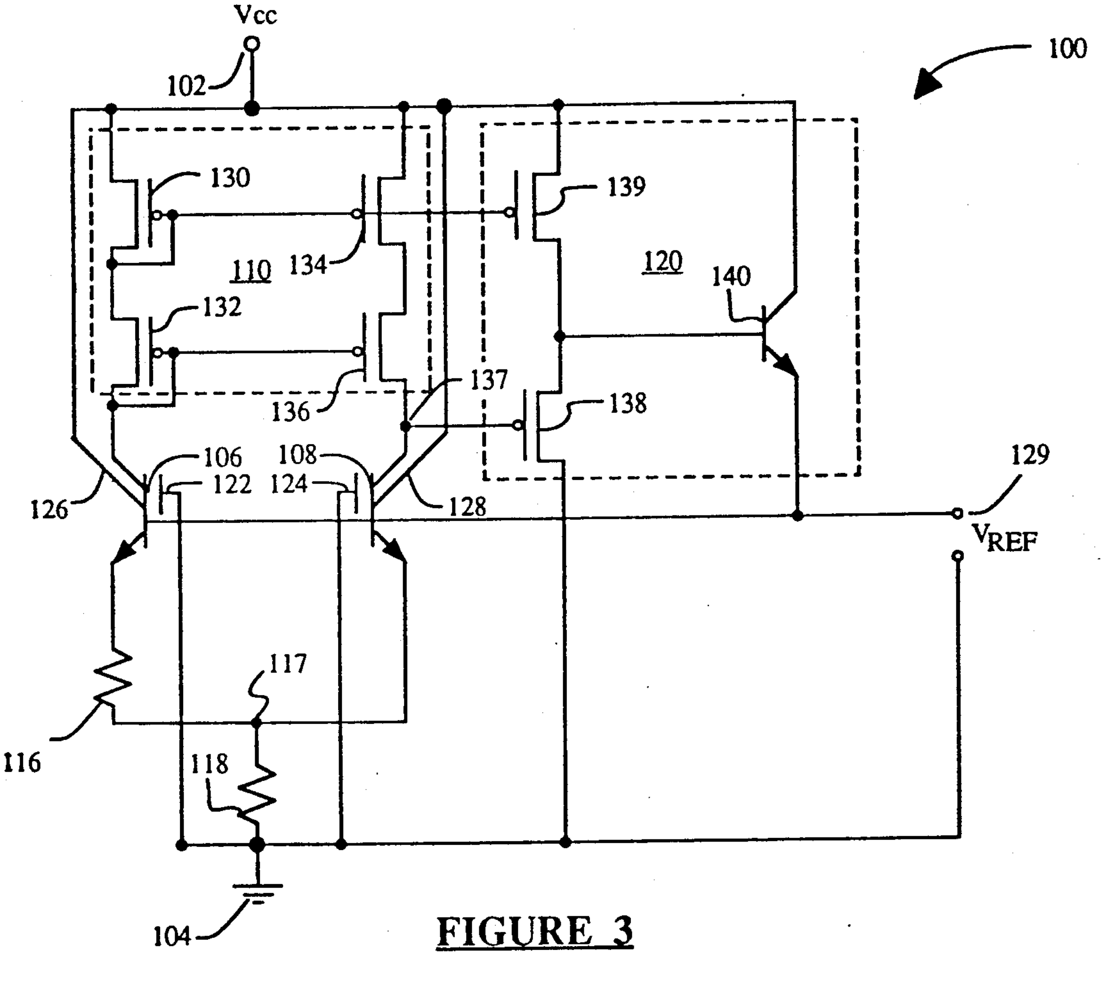
FIG. 3 is a detailed schematic diagram of the bandgap reference circuit of FIG. 2.

The detailed schematic of the bandgap reference 100 shown in FIG. 3 is similar to the FIG. 2 schematic, except that the current mirror 110 and the amplifier 120 are shown in detail. Current mirror 110 is a CMOS current mirror of conventional cascode design. When parasitic NPN transistor 106 draws an incremental current through reference PMOS transistors 130 and 132, the source-drain voltage of transistor pairs 130,134 and 132, 136 are increased equally. Hence, transistors 134 and 136 produce an approximately equal increment of current into node 137.

To reduce offset in the current mirror 110, the mirror 110 is designed to be as symmetrical as possible, and the transistors 130, 132, 134 and 136 are designed as large area transistors. Transistors 130 and 134 are operated in the full saturation region to minimize the sensitivity to $V_{cc}$ variation.

The amplifier 120 is a conventional two-stage source follower amplifier. The gate of the first stage PMOS transistor 138 is connected to the collector of transistor 108, and the drain is connected to ground. The base of the second stage, a conventional parasitic vertical NPN transistor 140, is connected to the source of transistor 138 and provides a low output impedance at its emitter, from which $V_{REF}$ is taken. The collector of transistor 140 is in the substrate of the chip, which is connected to VCC. MOS transistor 139 is connected between VCC and the source of transistor 138 to provide a current path. The gate of transistor 139 is connected to the gate circuits of transistors 130 and 134 of the current mirror 110, which maintains the operation of transistor 139 in deep saturation.

For proper operation of the lateral transistors 106 and 108, VCC is applied to the substrate, which forms the collectors 126 and 128 of the associated vertical transistors, and the respective gates 122 and 124 are biased below their threshold voltage. The latter is achieved, for example, by connecting the gates 122 and 124 to ground 104, as shown, or to the emitters of transistors 106 and 108 respectively.

Figure 4:
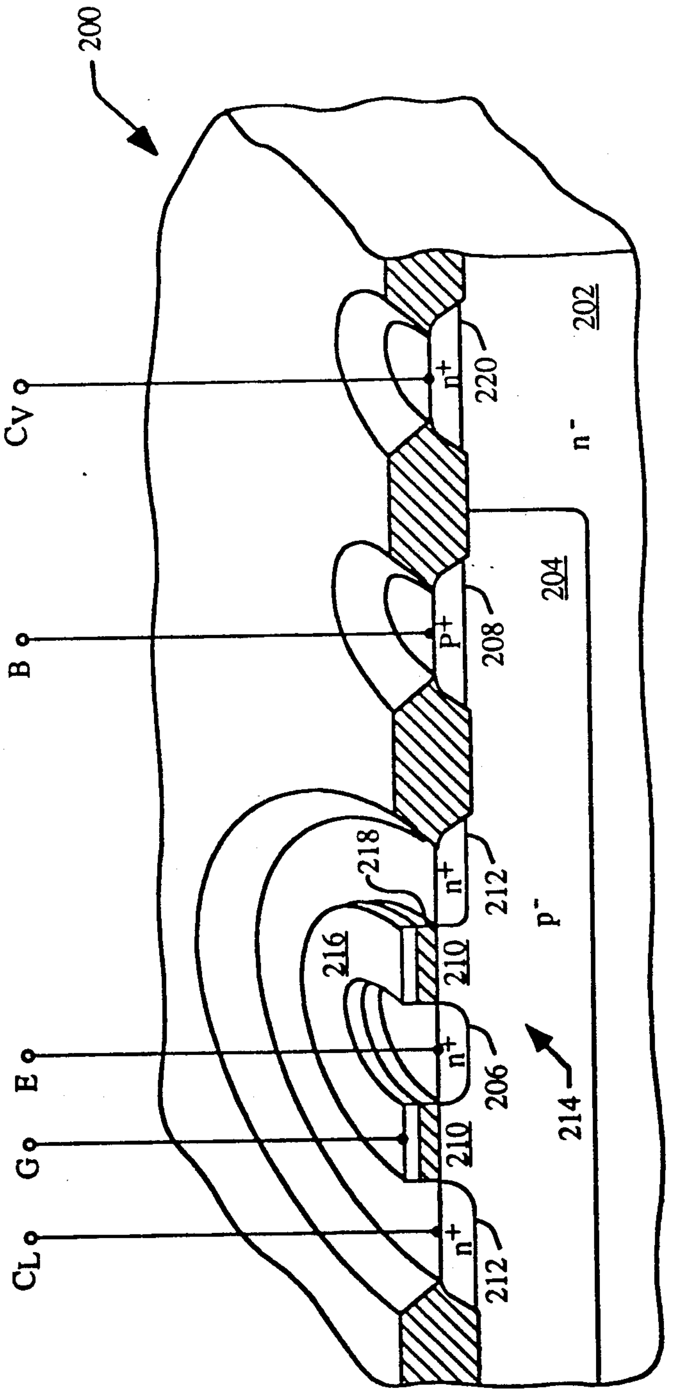
FIG. 4 is a three dimensional view showing in cross section a portion of a parasitic NPN transistor used in the bandgap reference circuit of FIG. 2.

A transistor 200 suitable for use as transistors 106 and 108 is shown in FIG. 4. The transistor 200 is realized in a p-well CMOS process, although other CMOS processes are suitable as well. A p-well 204 is provided in n- substrate 202. A lateral parasitic NPN transistor is obtained from a concentric layout that includes a circular n+ diffusion region 206 which functions as an emitter, surrounded by a ring-like p- region 210 of the p- well 204 which functions as a base, surrounded in turn by a ring-like n+ diffusion region 212 which functions as a collector. Connection is made to the base 210 through a p+ diffusion region 208. A polysilicon gate 216 overlays base 210 and is insulated therefrom by gate oxide 218. A vertical parasitic NPN transistor is obtained from the emitter 206 and the substrate 202 using a region 214 of the p-well 204 between emitter 206 and substrate 202 as the base. Connection to region 214 is made through p+ region 208, and connection to the substrate 202 is made through n+ doped region 220. As the lateral transistor is more important than the vertical transistor when the parasitic transistor 200 is used as transistor 106 or 108, the length of base 210 (i.e. gate 216) is minimized and the perimeter-to-surface ratio of the emitter 206 is maximized. Contact is made to the various regions 206, 208, 212, 216 and 220 in any suitable manner, as is well known in the art.

Transistor 200 is operated as follows. Note that the collector 212 of the lateral transistor is not tied to the substrate, while the collector 220 of the vertical transistor is tied to the substrate. The lateral transistor is made operational by biasing the gate 216 far below its threshold voltage in order to create an accumulation layer in the region 210, thereby preventing MOS transistor operation between regions 206 and 212. Base 208, emitter 206, and collector 212 are suitably biased as discussed above. The associated vertical transistor is active since the substrate (i.e. collector 220) is tied to VCC.

Typical values for bandgap reference circuit 100 follow, for VCC equal to 5.0 volts and $V_{REF}$ equal to 1.235 volts. Transistor 106 is laid out as eight individual transistors (n=8). Transistor 108 is laid out as an individual transistor. Transistor 108 and the individual transistors which combine to form transistor 106 are substantially identical. Transistor 140 is realized in such a way as to provide good drive capability. This is done by combining multiple individual transistors in parallel or by laying out the transistor with a large emitter area to boost the drive capability. Resistors 116 and 118 are p+ resistors of 1000 ohms and 7500 ohms respectively. Hence, the ratio R118/R116 is 7.5. Offset in the current mirror 110 is minimized by designing the mirror to be as symmetrical as possible. In addition, each transistor 130, 132, 134 and 136 is designed with a large area. The bandgap reference 100 requires no trimming. This is because there is no offset term in the reference generation circuit path.

While my invention has been described with respect to the embodiment set forth above, other embodiments and variations not described herein are to be considered within the scope of my invention. For example, my invention should not be limited by the specific type of transistor 200 used, or to any specific resistivity values and bias voltage values. These other embodiments and variations are to be considered within the scope of my invention, as defined by the following claims.

What is claimed:

1. A bandgap voltage reference for an integrated circuit having MOSFET devices, comprising:

a first parasitic bipolar transistor having a first semiconductor region doped with an impurity of a first type disposed between second and third semiconductor regions doped with an impurity of a second type opposite said first type impurity;

a second parasitic bipolar transistor having a first semiconductor region doped with an impurity of a first type disposed between second and third semiconductor regions doped with an impurity of a second type opposite said first type impurity;

a current source comprising:

a first MOSFET transistor having a first semiconductor region doped with an impurity of a first type disposed between second and third semiconductor regions doped with an impurity of a second type opposite said first type impurity, said first semiconductor region being associated with a gate and said gate being coupled to the third semiconductor region thereof; and a second MOSFET transistor having a first semiconductor region doped with an impurity of a first type disposed between second and third semiconductor regions doped with an impurity of a second type opposite said first type impurity, said first semiconductor region being associated with a gate and aid gate being coupled to the gate of said first MOSFET transistor;

wherein the third semiconductor region of said first MOSFET transistor is connected to the second semiconductor region of said first bipolar transistor, and wherein the third semiconductor region of said second MOSFET transistor is connected to the second semiconductor region of said second bipolar transistor;

a first resistor having one end coupled to the third semiconductor region of said first bipolar transistor and another end coupled to the third semiconductor region of said second bipolar transistor;

a second resistor having one end coupled to the third semiconductor region of said second bipolar transistor and another end coupled to a voltage supply; and an amplifier comprising a third parasitic bipolar transistor having a first semiconductor region doped with an impurity of a first type disposed between second and third semiconductor regions doped with an impurity of a second type opposite said first type impurity, the first semiconductor region thereof being coupled to the second semiconductor region of said second bipolar transistor, the second semiconductor region thereof being connected to a voltage supply, and the third semiconductor region thereof being connected to said first semiconductor region of said first and second bipolar transistors the potential between said third semiconductor region thereof and ground potential being a reference potential $V_{REF}$.

2. A bandgap voltage reference as in claim 1, wherein said first and second parasitic bipolar transistors are lateral NPN transistors, said third parasitic bipolar transistor is a vertical NPN transistor, and said first and second MOSFET transistors are p-channel MOSFET transistors.

3. A bandgap reference as in claim 2, wherein the respective first semiconductor regions of said first and second bipolar transistors are overlaid by respective insulated gates, said insulated gates being biased below their respective threshold voltages to create respective accumulation layers in the first semiconductor regions of said first and second bipolar transistors.

4. A bandgap reference circuit as in claim 1, wherein the base-emitter junction areas of said first and second bipolar transistors and the values of said first and second resistors are selected to yield a selected $\delta V_{REF}/\delta T$ in accordance with the differential expression:

$$\frac{\partial V_{REF}}{\partial T} = \frac{\partial V_{BE2}}{\partial T} + \left[\frac{R_1}{R_2}\ln(n)\right]\frac{\partial V_T}{\partial T}$$

wherein $V_{BE2}$ is the base-emitter junction potential of said second bipolar transistor, T is the absolute temperature and $V_T$ is the volt-equivalent of temperature, $R_1$ and $R_2$ are the resistivity of said first and second resistors respectively, and n is the ratio of the base-emitter area of said first bipolar transistor to the base-emitter area of said second bipolar transistor.

5. A bandgap reference circuit as in claim 4, wherein said selected $\delta V_{REF}/\delta T$ is zero.

6. A bandgap reference circuit as in claim 5, wherein the base-emitter junction areas of said first and second bipolar transistors and the values of said first and second resistors are selected to yield a selected $V_{REF}$ in accordance with the expression:

$$V_{REF} = V_{BE2} + \left[\frac{R_1}{R_2}\ln(n)\right]V_T$$

7. A CMOS bandgap voltage reference circuit comprising:

first and second parasitic lateral NPN transistors each having a base;

a first cascode CMOS amplifier having:

a first MOS transistor with a source connected to VCC and a drain connected to the gate thereof; and a second MOS transistor with a source connected to the drain of aid first MOS transistor and a drain connected to the gate thereof and to a collector of said first lateral NPN transistor;

a second cascode CMOS amplifier having:

a third MOS transistor with a source connected to VCC and a gate connected to the gate of said first MOS transistor; and a fourth MOS transistor with a source connected to the drain of said third MOS transistor, a gate connected to the gate of said second MOS transistor, and a drain connected to a collector of said second lateral NPN transistor;

a first resistor having one end connected to the emitter of said first lateral NPN transistor;

a second resistor having one end connected to the other end of said first resistor and to the emitter of said second lateral NPN transistor, and the other end connected to ground potential;

a third cascode CMOS amplifier having:

a fifth MOS transistor with a source connected to VCC and a gate connected to the gate of said first MOS transistor; and a sixth MOS transistor with a source connected to the drain of said fifth MOS transistor, a gate connected to the collector of said second lateral NPN transistor, and a drain connected to ground potential; and a parasitic NPN transistor having a collector connected to VCC, a base connected to the source of said sixth MOS transistor, and an emitter connected to the respective bases of said first and second lateral NPN transistors, the potential between said emitter and ground potential being a reference potential $V_{REF}$.

8. A bandgap reference circuit as in claim 7, wherein the base-emitter junction areas of said first and second lateral NPN transistors and the values of said first and second resistors are selected to yield a selected $\delta V_{REF}/\delta T$ in accordance with the differential expression:

$$\frac{\partial V_{REF}}{\partial T} = \frac{\partial V_{BE2}}{\partial T} + \left[\frac{R_1}{R_2}\ln(n)\right]\frac{\partial V_T}{\partial T}$$

wherein $V_{BE2}$ is the base-emitter junction potential of said second lateral NPN transistor, T is the absolute temperature and $V_T$ is the volt-equivalent of temperature, $R_1$ and $R_2$ are the resistivity of said first and second resistors respectively, and n is the ratio of the base-emitter area of said first lateral NPN transistor to the base-emitter area of said second lateral NPN transistor.

9. A bandgap reference circuit as in claim 8, wherein the value of said selected $\delta V_{REF}/\delta T$ is zero.

10. A bandgap reference circuit as in claim 9, wherein the base-emitter junction areas of said first and second lateral NPN transistors and the values of said first and second resistors are selected to yield a selected $V_{REF}$ in accordance with the expression:

$$V_{REF} = V_{BE2} + \left[\frac{R_1}{R_2}\ln(n)\right]V_T$$

11. A bandgap reference circuit as in claim 10, wherein the circuit portion comprising said first and second cascode CMOS amplifiers is of a symmetrical design, and said first, second, third and fourth MOS transistors are large area transistors.

* * * * *